(12) United States Patent
Hsiao et al.

(10) Patent No.: US 9,490,225 B2
(45) Date of Patent: Nov. 8, 2016

(54) PACKAGE STRUCTURE AND FABRICATION METHOD THEREOF

(71) Applicant: Siliconware Precision Industries Co., Ltd., Taichung (TW)

(72) Inventors: Wei-Chung Hsiao, Taichung (TW);
Chun-Hsien Lin, Taichung (TW);
Yu-cheng Pai, Taichung (TW);
Ming-Chen Sun, Taichung (TW);
Shih-Chao Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 143 days.

(21) Appl. No.: 14/452,731

(22) Filed: Aug. 6, 2014

(65) Prior Publication Data

US 2015/0348929 A1    Dec. 3, 2015

(30) Foreign Application Priority Data

May 27, 2014    (TW) .............................. 103118366 A

(51) Int. Cl.
*H01L 23/00* (2006.01)
*H01L 23/498* (2006.01)
*H01L 25/10* (2006.01)

(52) U.S. Cl.
CPC ............. *H01L 24/17* (2013.01); *H01L 23/498* (2013.01); *H01L 24/11* (2013.01); *H01L 25/105* (2013.01); *H01L 2224/16235* (2013.01); *H01L 2224/48091* (2013.01); *H01L 2224/48227* (2013.01); *H01L 2224/48235* (2013.01); *H01L 2224/81192* (2013.01); *H01L 2225/1023* (2013.01); *H01L 2225/1058* (2013.01); *H01L 2924/1533* (2013.01); *H01L 2924/15311* (2013.01)

(58) Field of Classification Search
CPC ..... H01L 24/11; H01L 24/17; H01L 23/498; H01L 25/105; H01L 2224/16235; H01L 2224/48091; H01L 2924/1533; H01L 2224/48235; H01L 2224/81192; H01L 2225/1023; H01L 2225/1058
See application file for complete search history.

(56) References Cited

U.S. PATENT DOCUMENTS

| | | | | |
|---|---|---|---|---|
| 7,180,165 B2 * | 2/2007 | Ellsberry | .......... | H01L 23/49816 257/685 |
| 7,498,668 B2 * | 3/2009 | Kawabata | ........... | H01L 25/0657 257/686 |
| 7,952,182 B2 * | 5/2011 | Watts | .................. | H01L 21/4853 257/686 |
| 2001/0028114 A1 * | 10/2001 | Hosomi | ................... | G11C 8/12 257/778 |

* cited by examiner

*Primary Examiner* — Roy Potter
(74) *Attorney, Agent, or Firm* — Mintz Levin Cohn Ferris Glovsky and Popeo, P.C.; Peter F. Corless; Steven M. Jensen

(57) ABSTRACT

A package structure is provided, which includes: a substrate having opposite top and bottom surfaces and a plurality of conductive pads and a plurality of conductive posts formed therein, wherein the conductive pads are exposed from the bottom surface of the substrate, and the conductive posts are electrically connected to the conductive pads and each of the conductive posts has an end surface exposed from the top surface of the substrate; a plurality of first conductive bumps formed on the end surfaces of the conductive posts; a plurality of second conductive bumps formed on the top surface of the substrate, wherein the second conductive bumps are higher than the first conductive bumps; and at least a first electronic element disposed on and electrically connected to the first conductive bumps, thereby increasing the wiring flexibility and facilitating subsequent disposing of electronic elements without changing existing machines.

20 Claims, 6 Drawing Sheets

PACKAGE STRUCTURE AND FABRICATION METHOD THEREOF

CROSS-REFERENCES TO RELATED APPLICATIONS

This application claims under 35 U.S.C. §119(a) the benefit of Taiwanese Application No. 103118366, filed May 27, 2014, the entire contents of which is incorporated herein by reference.

BACKGROUND OF THE INVENTION

1. Field of the Invention

The present invention relates to package structures and fabrication methods thereof, and more particularly, to a package structure having conductive bumps and a fabrication method thereof.

2. Description of Related Art

As electronic products are developed toward the trend of multi-function, high electrical performance and high operational speed, there have been developed various types of semiconductor package modules. For example, a multi-chip module (MCM) integrates a plurality of chips in a semiconductor device so as to meet the requirement of electronic products.

FIGS. 1A and 1B are schematic cross-sectional views of semiconductor devices having a plurality of chips integrated therein. Referring to FIG. 1A, a plurality of semiconductor chips 11 are vertically stacked on a substrate 10. Alternatively, referring to FIG. 1B, a plurality of semiconductor chips 11 are horizontally disposed a substrate 10. However, electrical and reliability tests on the semiconductor chips 11 of FIGS. 1A and 1B can only be performed after a packaging process is completed. If any one of the semiconductor chips 11 fails the test, the overall semiconductor device must be discarded.

Accordingly, another type of semiconductor device is provided by U.S. Pat. No. 6,303,997. Referring to FIG. 1C, both a semiconductor chip 11 and a semiconductor package 12 are disposed on an upper surface of a substrate 10 and electrically connected to the substrate 10. To form the semiconductor device, the semiconductor chip 11 is first electrically connected to the substrate 10 through bonding wires 111 and a test is performed to the semiconductor chip 11. If it is determined that the semiconductor chip 11 functions normal, the BGA-type semiconductor package 12 that is already packaged and tested is then electrically connected to the substrate 10 through a plurality of solder balls 121. Thereafter, a test is performed to the overall structure, thus overcoming the above-described drawback of waste of known good dies.

However, to electrically connect the semiconductor chip 11 and the semiconductor package 12 to the substrate 10, a plurality of wire bonding pads and solder ball pads need to be formed on the substrate 10. As such, not only wiring on the substrate is limited, but also high density interconnect technologies, for example, built-up substrate technologies are required, thus incurring a high fabrication cost.

Accordingly, a further type of semiconductor device is disclosed by U.S. Pat. No. 5,783,870. Referring to FIG. 1D, a first semiconductor package 12a is electrically connected to a substrate 10 through a plurality of solder balls 121a. Further, a second semiconductor package 12b is stacked on a first semiconductor package 12a through a plurality of solder balls 121b, and similarly, a third semiconductor package 12c is stacked on the second semiconductor package 12b, thus forming a modular semiconductor device. As such, both the second semiconductor package 12b and the third semiconductor package 12c are electrically connected to the substrate 10. In addition, the semiconductor packages 12a, 12b, 12c are respectively tested before being disposed in a stack manner, thus overcoming the above-described drawback of waste of known good dies.

However, since a lower semiconductor package has a chip mounting area, the solder balls of an upper semiconductor package for electrically connecting the upper and lower semiconductor packages must be bonded to a region outside the chip mounting area, thereby limiting the electrically connecting area and wiring on the substrate as well as the I/O count and arrangement of the upper semiconductor package. Consequently, the design flexibility of the overall device is reduced.

Therefore, how to overcome the above-described drawbacks has become critical.

SUMMARY OF THE INVENTION

In view of the above-described drawbacks, the present invention provides a method for fabricating a package structure, which comprises the steps of: providing a substrate having opposite top and bottom surfaces, wherein the substrate has a plurality of conductive pads and a plurality of conductive posts formed therein, the conductive pads are exposed from the bottom surface of the substrate and the conductive posts are electrically connected to the conductive pads and exposed from the top surface of the substrate; forming a conductive layer on the top surface of the substrate; forming a plurality of first conductive bumps and a plurality of second conductive bumps on the conductive layer, wherein the second conductive bumps are higher than the first conductive bumps; removing the conductive layer exposed the first conductive bumps and the second conductive bumps; and disposing and electrically connecting at least a first electronic element to the first conductive bumps.

The present invention further provides a package structure, which comprises: a substrate having opposite top and bottom surfaces and a plurality of conductive pads and a plurality of conductive posts formed therein, wherein the conductive pads are exposed from the bottom surface of the substrate, and the conductive posts are electrically connected to the conductive pads and each of the conductive posts has an end surface exposed from the top surface of the substrate; a plurality of first conductive bumps formed on the end surfaces of the conductive posts; a plurality of second conductive bumps formed on the top surface of the substrate, wherein the second conductive bumps are higher than the first conductive bumps; and at least a first electronic element disposed on and electrically connected to the first conductive bumps.

According to the present invention, after the first electronic element is disposed on and electrically connected to the first conductive bumps, a second electronic element can be disposed on and electrically connected to the second conductive bumps. Since the second conductive bumps are higher than the first conductive bumps, the first electronic element can be received in a receiving space formed by the second electronic element, the second conductive bumps and the substrate. As such, the electrically connecting area is not limited and the height of the package structure is effectively reduced.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modifications and variations can be made without departing from the spirit of the present invention. Further, terms such as "first", "second", "on", "a" etc. are merely for illustrative purposes and should not be construed to limit the scope of the present invention.

FIGS. 2A to 2D are schematic cross-sectional views showing a method for fabricating a substrate according to the present invention.

Figure 1A:
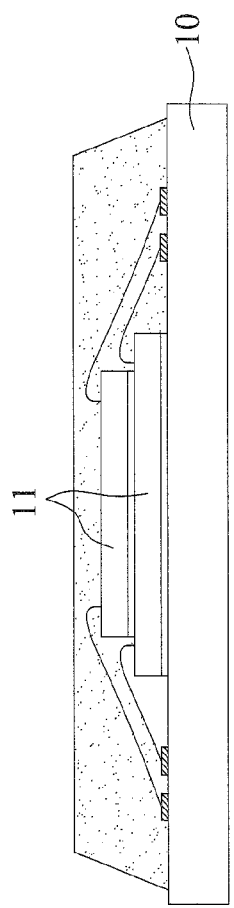
FIGS. 1A to 1D are schematic cross-sectional views showing methods for fabricating package structures according to the prior art.
Figure 1B:
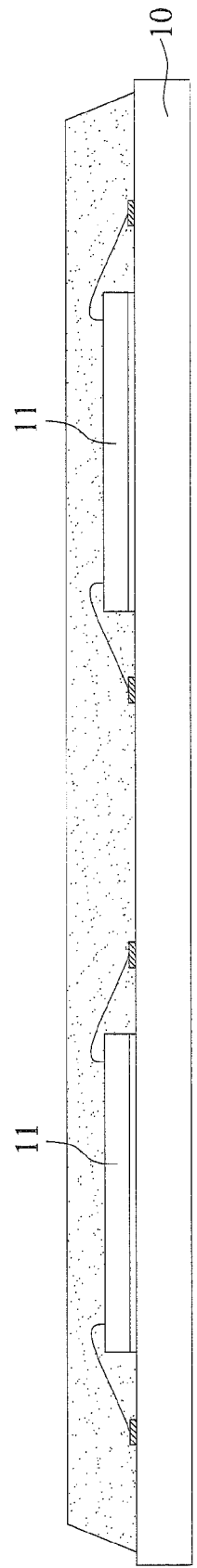
Figure 1C:
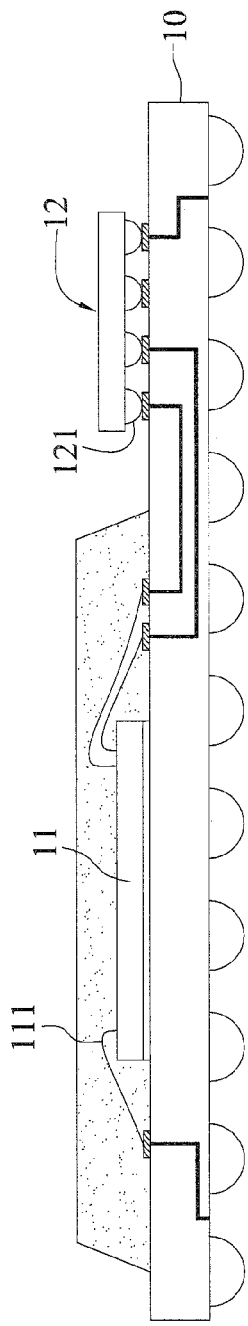
Figure 1D:
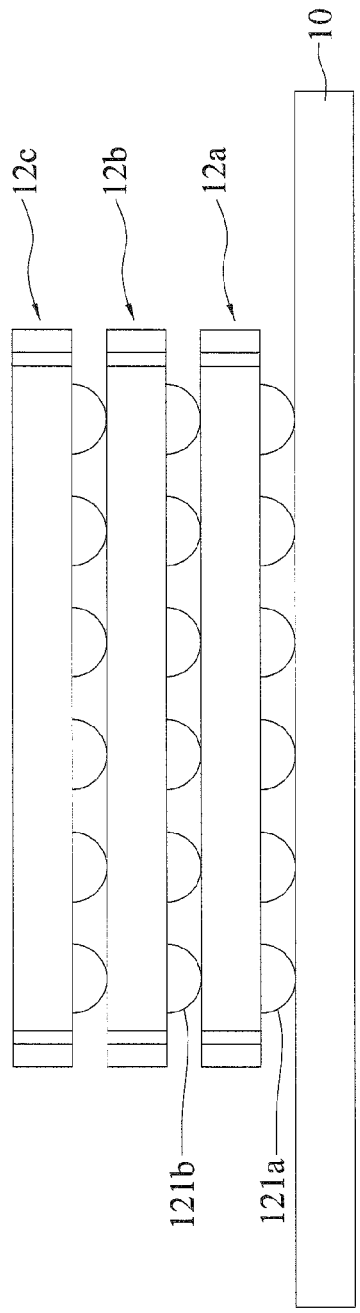
Figure 2A:
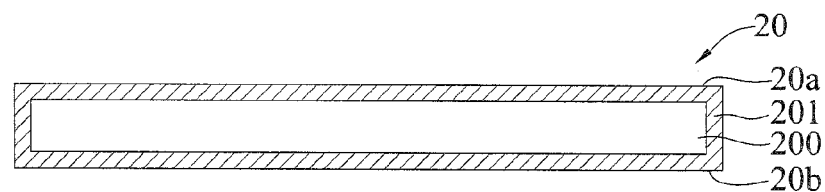
FIGS. 2A to 2D are schematic cross-sectional views showing a method for fabricating a substrate according to the present invention.

Referring to FIG. 2A, a release member 20 having opposite first and second surfaces 20a, 20b is provided.

In the present embodiment, the release member 20 has a core layer 200 made of iron and another metal material 201 formed on the core layer 200.

Figure 2B:
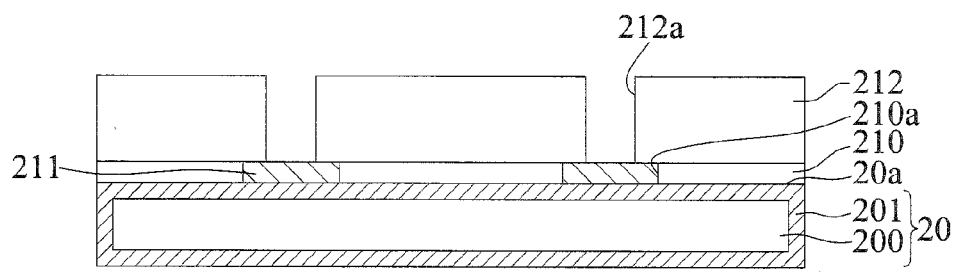
Figure 2C:
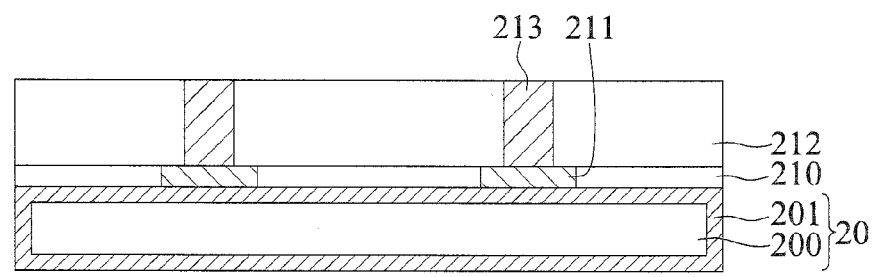

Referring to FIGS. 2B and 2C, a plurality of conductive pads 211 are formed on the first surface 20a of the release member 20, and a plurality of conductive posts 213 are formed on the conductive pads 211.

In the present embodiment, referring to FIG. 2B, a first resist layer 210 having a plurality of first openings 210a is first formed on the first surface 20a of the release member 20 and then a conductive material is filled in the first openings 210a of the first resist layer 210 so as to form the conductive pads 211. Thereafter, a second resist layer 212 is formed on the first resist layer 210 and a plurality of second openings 212a are formed in the second resist layer 212 for exposing a portion of each of the conductive pads 211.

Referring to FIG. 2C, a conductive material is filled in the second openings 212a of the second resist layer 212 so as to form the conductive posts 213.

In the present embodiment, the conductive material is made of, but not limited to, copper.

Figure 2D:
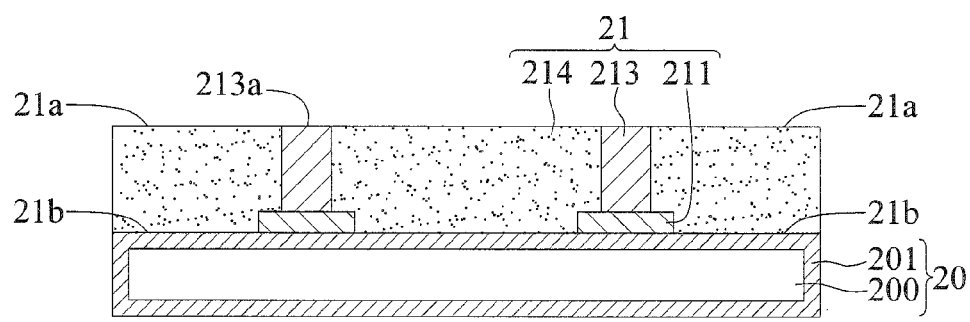

Referring to FIG. 2D, the first resist layer 210 and the second resist layer 212 are removed to expose the conductive posts 213 and the conductive pads 211. Further, a dielectric layer 214 is formed on the release member 20, and the conductive posts 213 and the conductive pads 211 are embedded in the dielectric layer 214. The dielectric layer 214 has a top surface 21a and a bottom surface 21b opposite to the top surface 21a and bonded to the release member 20.

In the present embodiment, after the dielectric layer 214 is formed to encapsulate the conductive posts 213 and the conductive pads 211, the top surface 21a of the dielectric layer 214 is ground to expose an end surface 213a of each of the conductive posts 213. As such, a substrate 21 having opposite top and bottom surfaces 21a, 21b is obtained.

FIGS. 3A to 3I are schematic cross-sectional views showing a method for fabricating a package structure according to the present invention. Therein, FIG. 3G' shows another embodiment of FIG. 3G.

Figure 3A:
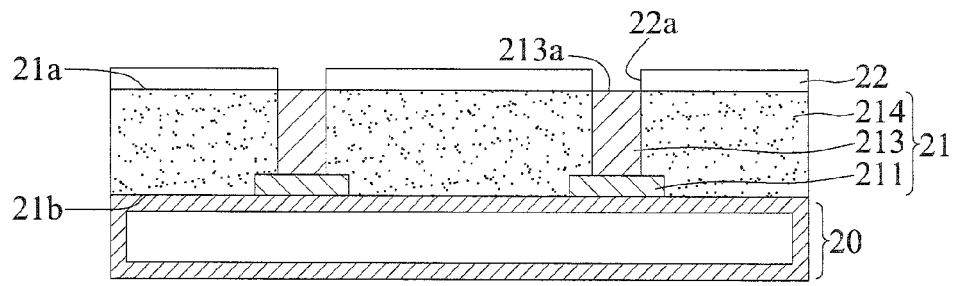
FIGS. 3A to 3I are schematic cross-sectional views showing a method for fabricating a package structure according to the present invention, wherein FIG. 3G' shows another embodiment of FIG. 3G.

Referring to FIG. 3A, continued from FIG. 2D, a polymer layer 22 is formed on the top surface 21a of the substrate 21 and a plurality of openings 22a are formed in the polymer layer 22 for exposing the end surfaces 213a of the conductive posts 213.

In the present embodiment, the polymer layer 22 is made of a lower-profile polymer dielectric material, for example, an epoxy resin.

Figure 3B:
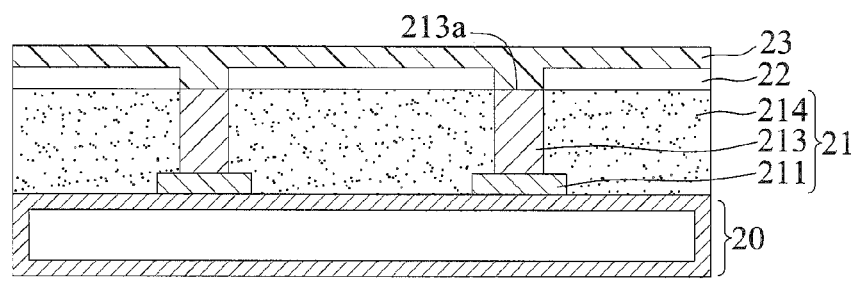

Referring to FIG. 3B, a conductive layer 23 is formed on the polymer layer 22.

In the present embodiment, the conductive layer 23 is made of deposited copper. The polymer layer 22 facilitates to improve the bonding between the conductive layer 23 and the substrate 21.

Then, Referring to FIGS. 3C to 3F, a plurality of first conductive bumps 25 and a plurality of second conductive bumps 27 are formed on the conductive layer 23.

Figure 3C:
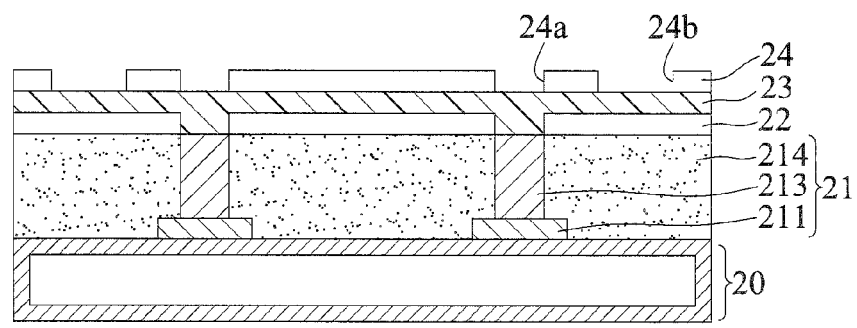

Referring to FIG. 3C, a third resist layer 24 is formed on the conductive layer 23. A plurality of third openings 24a are formed in the third resist layer 24 to expose portions of the conductive layer 23 corresponding in position to the end surfaces 213a of the conductive posts 213, and a plurality of fourth openings 24b are formed in the third resist layer 24 to expose portions of the conductive layer 23 not corresponding in position to the end surfaces 213a of the conductive posts 213.

In the present embodiment, the third openings 24a are less in width than the fourth openings 24b.

Figure 3D:
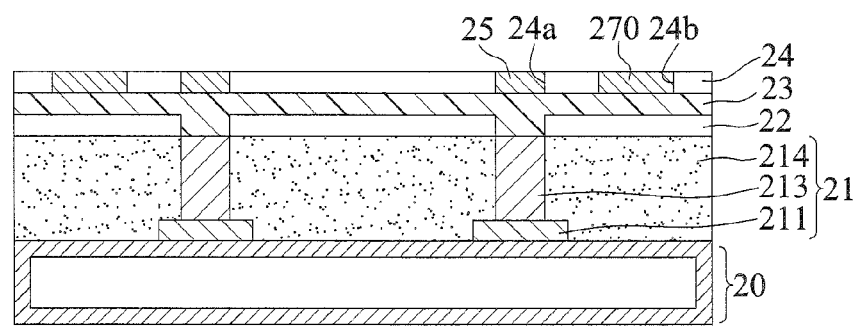

Referring to FIG. 3D, a conductive material is filled in the third openings 24a and the fourth openings 24b so as to form a plurality of first conductive bumps 25 and support portions 270 electrically connected to the conductive posts 213.

In the present embodiment, the first conductive bumps 25 and the support portions 270 have a same height, and the first conductive bumps 25 are less in width than the support portions 270.

Figure 3E:
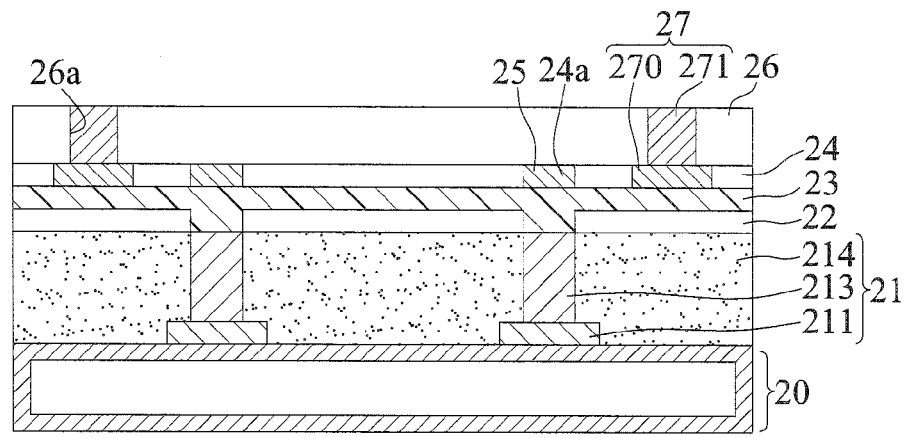

Referring to FIG. 3E, a fourth resist layer 26 is formed on the third resist layer 24 and a plurality of fifth openings 26a are formed in the fourth resist layer 26 for exposing the support portions 270. Then, a conductive material is filled in the fifth openings 26a to form bump portions 271 on the support portions 270. The support portions 270 and the bump portions 271 on the support portions 270 form the second conductive bumps 27.

In the present embodiment, the width of the support portions 270 is greater than or equal to the corresponding bump portions 271.

Figure 3F:
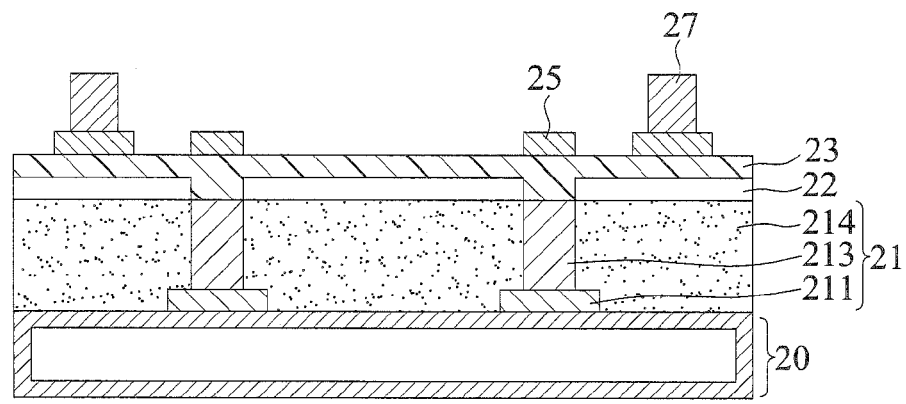

Referring to FIG. 3F, the third resist layer 24 and the fourth resist layer 26 are removed to expose the first conductive bumps 25 and the second conductive bumps 27.

In the present embodiment, the second conductive bumps 27 are higher than the first conductive bumps 25, and greater in width than the first conductive bumps 25.

Figure 3G:
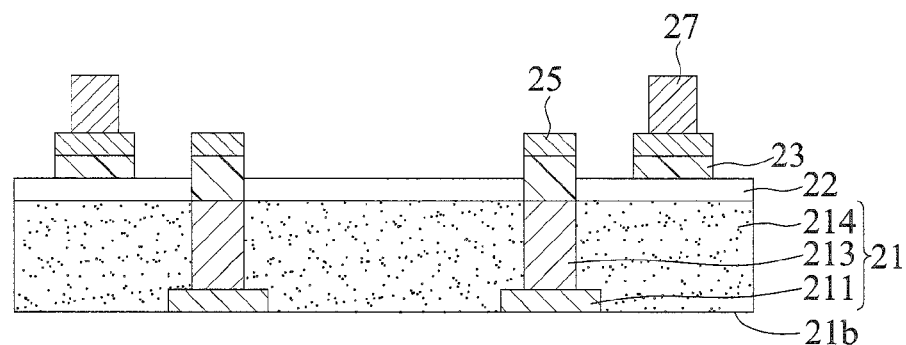
Figure 3G:
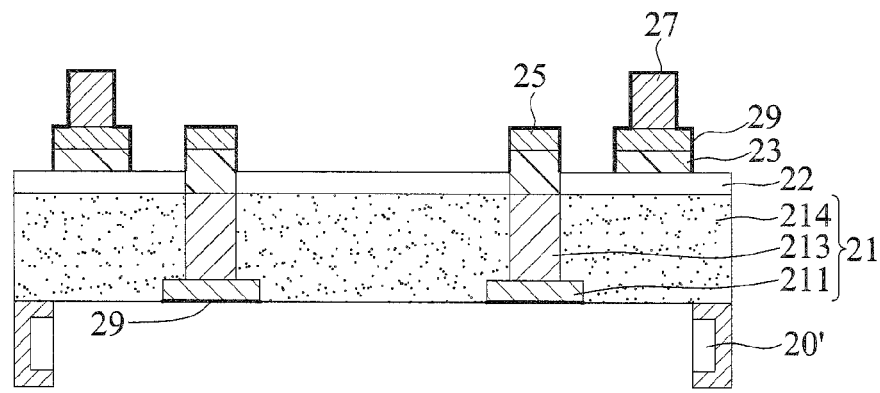

Referring to FIG. 3G, the conductive layer 23 exposed from the first conductive bumps 25 and the second conductive bumps 27 is removed, thereby exposing a portion of the polymer layer 22.

In the present embodiment, the release member 21 is also removed to expose the conductive pads 211 and the bottom surface 21b of the substrate 21.

In another embodiment, referring to FIG. 3G', a surface processing layer 29, for example, an OSP layer, is further formed on the first conductive bumps 25, the second conductive bumps 27 and the conductive pads 211. Furthermore, only a portion of the release member 20 is removed to expose the conductive pads 211 and the remaining portion 20' of the release member 20 is used to prevent material overflow during formation of the surface processing layer 29 and provide a rigid support to the overall structure.

Figure 3H:
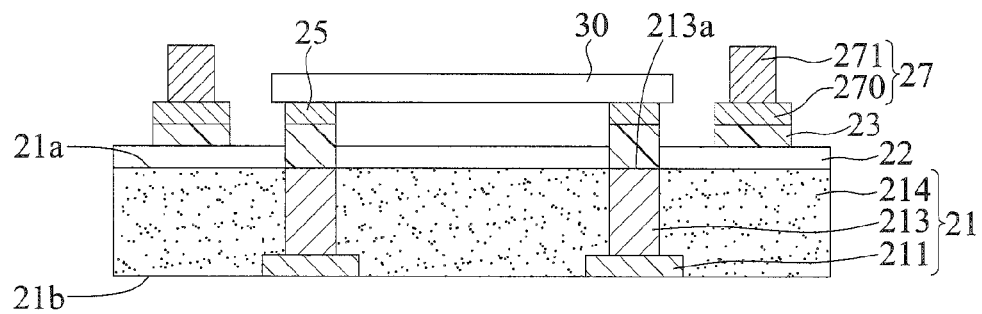

Referring to FIG. 3H, continued from FIG. 3G, at least a first electronic element 30 is disposed on and electrically connected to the first conductive bumps 25.

In the present embodiment, the second conductive bumps 27 are higher than the total height of the first conductive bumps 25 and the first electronic element 30. The first electronic element 30 is a semiconductor chip, or a packaged or unpackaged semiconductor element. Preferably, the first electronic element 30 is a semiconductor chip that is determined to be a good chip through a test.

Figure 3I:
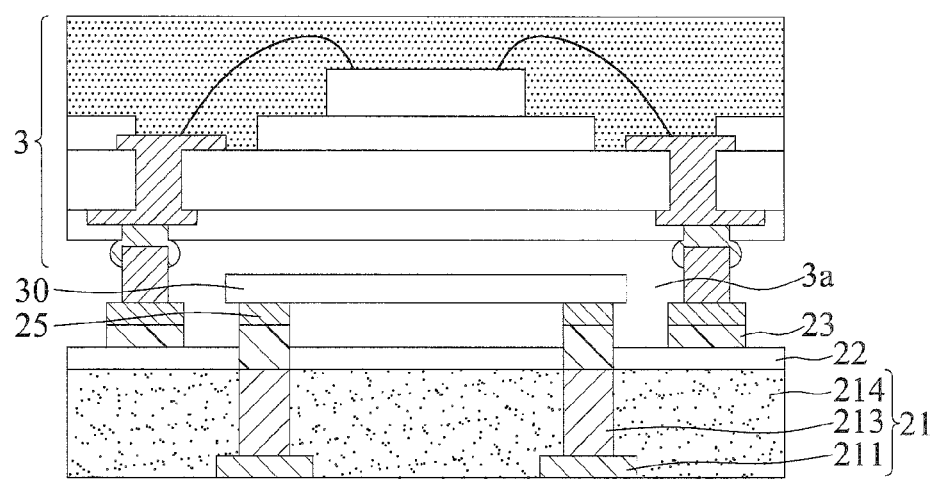

Referring to FIG. 3I, at least a second electronic element 3 is disposed on and electrically connected to the second conductive bumps 27, and a receiving space 3a is formed by the second conductive bumps 27, the second electronic element 3 and the substrate 21 so as to receive the first electronic element 30. That is, the first electronic element 30 is positioned between the substrate 21 and the second electronic element 3.

In the present embodiment, the second electronic element 3 is a substrate, a semiconductor chip, an interposer, or a packaged or unpackaged semiconductor element.

Referring to FIG. 3H, the package structure of the present invention has: a substrate 21 having opposite top and bottom surfaces 21a, 21b and a plurality of conductive pads 211 and a plurality of conductive posts 213 formed therein, wherein the conductive pads 211 are exposed from the bottom surface 21b of the substrate 21, and the conductive posts 213 are electrically connected to the conductive pads 211 and each of the conductive posts 213 has an end surface 213a exposed from the top surface 21a of the substrate 21; a plurality of first conductive bumps 25 formed on the end surfaces 213a of the conductive posts 213; a plurality of second conductive bumps 27 formed on the top surface 21a of the substrate 21, wherein the second conductive bumps 27 are higher than the first conductive bumps 25; and at least a first electronic element 30 disposed on and electrically connected to the first conductive bumps 25.

In the present embodiment, the package structure further has a polymer layer 22 formed on the top surface 21a of the substrate 21, and the end surfaces 213a of the conductive posts 213 are exposed from the polymer layer 22. The package structure further has a conductive layer 23 formed between the end surfaces 213a of the conductive posts 213 and the first conductive bumps 25 and between the polymer layer 22 and the second conductive bumps 27.

In the present embodiment, each of the second conductive bumps 27 has a support portion 270 formed on the top surface 21a of the substrate 21 and a bump portion 271 formed on the support portion 270. The second conductive bumps 27 are higher than the total height of the first conductive bumps 25 and the first electronic element 30.

Further, a circuit layer (not shown) can be formed on the top surface 21a of the substrate 21 for electrically connecting the first and second conductive bumps 25, 27 to the conductive posts 213.

According to the present invention, after the first electronic element is disposed on and electrically connected to the first conductive bumps, a second electronic element, for example, an external element, can be disposed on and electrically connected to the second conductive bumps. Since the second conductive bumps are higher than the first conductive bumps, the first electronic element can be received in a receiving space formed by the second electronic element, the second conductive bumps and the substrate. Therefore, the present invention eliminates the limit on the electrically connecting area without changing existing machines and increases the wiring flexibility.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A method for fabricating a package structure, comprising the steps of:
   providing a substrate having opposite top and bottom surfaces, wherein the substrate has a plurality of conductive pads and a plurality of conductive posts formed therein, the conductive pads are exposed from the bottom surface of the substrate and the conductive posts are electrically connected to the conductive pads and exposed from the top surface of the substrate;
   forming a conductive layer on the top surface of the substrate;
   forming a plurality of first conductive bumps and a plurality of second conductive bumps on the conductive layer, wherein the second conductive bumps are higher than the first conductive bumps;
   removing the conductive layer exposed from the first conductive bumps and the second conductive bumps; and
   disposing and electrically connecting at least a first electronic element to the first conductive bumps.

2. The method of claim 1, wherein the substrate is fabricated by:
   providing a release member having opposite first and second surfaces;
   forming the conductive pads on the first surface of the release member;
   forming the conductive posts on the conductive pads;
   forming a dielectric layer on the first surface of the release member so as to embed the conductive pads and the conductive posts in the dielectric layer, wherein an end surface of each of the conductive posts is exposed from the dielectric layer; and
   removing the release member to expose the conductive pads, thereby forming the substrate having the top surface exposing the end surfaces of the conductive posts and the opposite bottom surface exposing the conductive pads.

3. The method of claim 2, wherein forming the conductive pads and the conductive posts comprises:
   forming a first resist layer on the first surface of the release member, wherein the first resist layer has a plurality of first openings;
   forming the conductive pads in the first openings of the first resist layer;
   forming a second resist layer on the first resist layer and the conductive pads, wherein the second resist layer has a plurality of second openings exposing a portion of each of the conductive pads;
   forming the conductive posts in the second openings; and
   removing the first resist layer and the second resist layer.

4. The method of claim 2, after forming the dielectric layer, further comprising grinding the dielectric layer to expose the end surfaces of the conductive posts.

5. The method of claim 1, before forming the conductive layer, further comprising forming a polymer layer on the top surface of the substrate in a manner that an end surface of each of the conductive posts is exposed from the polymer layer, thus allowing the conductive layer to be formed on the polymer layer and the end surfaces of the conductive posts.

6. The method of claim 5, wherein forming the first conductive bumps and the second conductive bumps comprises:
   forming a third resist layer on the conductive layer, wherein the third resist layer has a plurality of third openings for exposing portions of the conductive layer corresponding in position to the end surfaces of the conductive posts and a plurality of fourth openings for exposing portions of the conductive layer not corresponding in position to the end surfaces of the conductive posts;
   forming the first conductive bumps in the third openings and forming support portions in the fourth openings;
   forming a fourth resist layer on the third resist layer, wherein the fourth resist layer has a plurality of fifth openings exposing the support portions;
   forming bump portions on the support portions in the fifth openings, the support portions and the bump portions on the support portions forming the second conductive bumps; and
   removing the third resist layer and the fourth resist layer.

7. The method of claim 1, before disposing the first electronic element, further comprising forming a surface processing layer on the first conductive bumps, the second conductive bumps and the conductive pads.

8. The method of claim 1, further comprising disposing and electrically connecting at least a second electronic element to the second conductive bumps, wherein the first electronic element is positioned between the substrate and the second electronic element.

9. The method of claim 1, wherein the top surface of the substrate further has a circuit layer for electrically connecting the first and second conductive bumps to the conductive posts.

10. A package structure, comprising:
   a substrate having opposite top and bottom surfaces and a plurality of conductive pads and a plurality of conductive posts formed therein, wherein the conductive pads are exposed from the bottom surface of the substrate, and the conductive posts are electrically connected to the conductive pads and each of the conductive posts has an end surface exposed from the top surface of the substrate;
   a plurality of first conductive bumps formed on and corresponding in position to the end surfaces of the conductive posts;
   a plurality of second conductive bumps formed on the top surface of the substrate, wherein the second conductive bumps are higher than the first conductive bumps; and
   at least a first electronic element disposed on and electrically connected to the first conductive bumps.

11. The structure of claim 10, wherein the second conductive bumps are higher than the total height of the first conductive bumps and the first electronic element.

12. The structure of claim 10, further comprising a polymer layer formed on the top surface of the substrate in a manner that the end surfaces of the conductive posts are exposed from the polymer layer and the second conductive bumps are formed on the polymer layer.

13. The structure of claim 10, further comprising a conductive layer formed between the end surfaces of the conductive posts and the first conductive bumps and between the top surface of the substrate and the second conductive bumps.

14. The structure of claim 10, wherein each of the second conductive bumps has a support portion formed on the top surface of the substrate and a bump portion formed on the support portion.

15. The structure of claim 14, wherein the support portion has a width greater than or equal to that of the bump portion.

16. The structure of claim 10, wherein the first electronic element is a semiconductor chip, or a packaged or unpackaged semiconductor element.

17. The structure of claim 10, further comprising at least a second electronic element disposed on and electrically connected to the second conductive bumps, wherein the first electronic element is positioned between the substrate and the second electronic element.

18. The structure of claim 17, wherein the second electronic element is a substrate, a semiconductor chip, an interposer, or a packaged or unpackaged semiconductor element.

19. The structure of claim 10, further comprising a surface processing layer formed on the first conductive bumps, the second conductive bumps and the conductive pads.

20. The structure of claim 10, further comprising a circuit layer formed on the top surface of the substrate for electrically connecting the first and second conductive bumps to the conductive posts.

* * * * *